March 29, 1966 MASAICHI SHINODA 3,243,325

METHOD OF PRODUCING A VARIABLE-CAPACITANCE GERMANIUM DIODE AND PRODUCT PRODUCED THEREBY

Filed June 5, 1963

United States Patent Office 3,243,325

Patented Mar. 29, 1966

3,243,325

METHOD OF PRODUCING A VARIABLE-CAPACITANCE GERMANIUM DIODE AND PRODUCT PRODUCED THEREBY

Masaichi Shinoda, Kawasaki-shi, Japan, assignor to Fujitsu Limited, Kawasaki, Japan, a corporation of Japan Filed June 5, 1963, Ser. No. 285,712
Claims priority, application Japan, June 9, 1962, 37/23,993
4 Claims. (Cl. 148—178)

My invention relates to germanium p-n junction diodes of variable capacitance applicable for frequency modulation or parametric amplification, for example. In a more particular aspect, my invention relates to germanium diodes with a hyper-abrupt p-n junction in which the dopant atom concentration in the junction-forming p-type region or n-type region or in both regions decreases with the distance from the junction.

It is an object of my invention to produce variable capacitance diodes that afford a larger range of capacitance variation in response to a given bias voltage than the known diodes with junctions of the abrupt or graded types. Another object of the invention is to provide hyper-abrupt-junction diodes of an extremely wide capacitance range which renders the diodes advantageously applicable for a large diversity of applications.

To achieve these objects, and in accordance with my invention, a germanium variable capacitance diode is produced by contacting a crystalline germanium body, preferably a monocrystalline wafer, with an alloy of lead and donor impurity that also contains a sufficient amount of one or more acceptor impurities to produce a p-n junction in the germanium body, the donor content of the lead alloy being 0.02 to 5% by weight of antimony or 0.01 to 0.5% by weight of arsenic. No other constituent than those mentioned need be present in the alloy. The lead-donor-acceptor alloy is then heated together with the germanium body to a temperature of 550 to 720° C. to simultaneously cause alloying and diffusion of the donor and acceptor atoms into the germanium, thus forming therein an hyper-abrupt p-n junction.

According to preferred embodiments of the invention, the above-described lead alloy contains gallium as acceptor substance in the amount known for such purposes, for example in a quantity corresponding to $10^{17}$ to $10^{21}$ or about $10^{20}$ atoms per cc. The maximum concentration of gallium in the p-type region at the p-n junction in the finished diode is about $10^{16} \sim 10^{19}$ per cubic centimeter. The other acceptor substances, such as aluminum, indium or boron can be used, containing 0.1 to 10% by atom. The donor substance preferably used is antimony in an amount of about 0.02 to about 3.0% by weight. The n-type germanium used may have a specific resistance of about 0.1 to about 20 ohm-cm. in accordance with the needed capacitance characteristics. As will appear from the example described hereinafter, the components can be chosen within the stated ranges to obtain variable capacitance diodes of a desired rate of capacitance change ($n$) such as between $n=1$ and $n=7$, for example.

The invention will be further explained with reference to the accompanying drawings in which.

Semiconductor diodes that exhibit a large range of capacitance variation under control by a small change of negative bias voltage are applicable for widely different purposes, such as in modulators or amplifiers (IRE Transactions, vol. ED–8, 1961, page 370). If the relation between capacitance C and applied bias voltage V is expressed by $$C \alpha V^{-n}$$

and $n$ represents a number, then the range of $$1 \leqq n < 10$$

is considered to indicate the suitable range for general use of the diode in practice, assuming that for a germanium diode the bias voltage is 1 to 15 v. and the breakdown voltage is 10 to 100 v.

For achieving such a desirable characteristic, the concentration of the donor atoms (n-type impurities) around the p-n junction is one of the most important elements.

Figure 1:
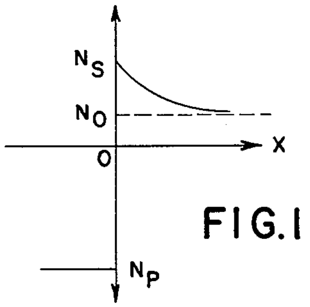
FIG. 1 is an explanatory graph.

The location of the p-n junction is indicated at $x=0$ on the abscissa of FIG. 1 which represents diagrammatically the dopant impurity distribution relative to the cross section of a diode. The ordinate indicates impurity concentration. N$p$ denotes the concentration of p-type impurities (acceptors) at the junction, and N$o$ the relatively low concentration of n-type (donor) impurities in the germanium body being used.

As mentioned, a variable capacitance or multi-purpose germanium diode which according to the invention affords a considerable improvement toward the above-mentioned aim, involves an alloy-diffusion method. I have found that such a conjoint alloying and diffusion process, using the above-described lead-donor-acceptor alloy, is best suitable for reliably securing the desired improved results, as will be more fully explained hereinbelow. Alloy-diffusion techniques for producing p-n junctions in semiconductor crystals are known as such, and it is also known that lead can be used as a carrier metal when applying such a technique to germanium (Proceedings of the Physical Society, vol. 70B, 1957, page 1087). However, admixing p-type impurity and n-type impurity to lead and then alloying the mixture to germanium involves a four-element phase system of at least four components; and such a system and the segregation coefficients which occur in such a system and determine the distribution of impurities in the vicinity of the resulting p-n junction, have not been known. It has nevertheless been established according to my invention, on the basis of comprehensive investigation, that by employing the above described ternary alloy predominantly consisting of lead, and alloying it together with germanium, the theoretically most desirable variable-capacitance characteristic of the germanium diode is indeed realized and made reliably reproducible. The use of lead against germanium as a carrier also takes advantage of the particularly good thermal, mechanical and electrical properties of this metal in conjunction with the dopant impurity additions contained in the alloy.

That is, a capacitance characteristic according to the above-mentioned criterion, with the value of $n$ being between 1 and 10, can readily be produced by virtue of giving the dopant impurities in the germanium the desired distribution. As mentioned, this requires applying a temperature of 550 to 720° C., using 0.02 to 5% antimony or 0.01 to 0.5% arsenic as n-type impurity in addition to lead containing p-type impurity in an amount sufficient to produce a p-n junction. The alloy-diffusion treatment within the stated temperature range must be performed within a suitable period of time in order to obtain the hyper-abrupt junction required for good variable-capacitance properties. If a temperature above 720° C. is used, it is difficult to obtain a junction of the hyper-abrupt type and it is also extremely difficult to obtain a breakdown voltage of more than 10 v. When a temperature below 550° C. is employed, the necessary diffusing time is excessive and is always longer than ten hours even with Sb or As concentrations at the upper limit of the stated ranges, which renders the process uneconomical; and if the concentration of the n-type impurity in the lead is larger than the above-mentioned values it is not only difficult to meet the above-stated voltage requirements but also to keep the value of $n$ within the desired range. If the concentration of the $n$-type impurity in lead is below the range given above, it becomes very difficult to make the value of $n$ larger than unity.

The following examples will illustrate the length of time during which the alloy-diffusion heating is preferably applied. When the lead-alloy grain contains smallest applicable amounts of donor impurity, namely 0.02% Sb or 0.01% As the time required for best results was found to be about 16 hours at 720° C., but would have to be prolonged to about 165 hours at 550° C. Extending the duration of the heat treatment beyond these limits was found to have similar detrimental results on the above-mentioned application of a temperature above 720° C. When employing the n-type impurities at higher concentrations, the duration of the heat treatment must be shortened. Thus, for a lead-alloy with 2% Sb the duration should be about 1 hour at 720° C. or 8 hours at 550° C. At temperatures between 550° C. and 720° C., the heat treating time should be given a corresponding length intermediate those stated for the two limits of the temperature range. The range of the diffusion temperature and substances are important to take hyper-abrupt junction. The diffusion time has the secondary meaning and makes V$n$ change, that is, V$n$ is such voltage as $n$ is largest. For that reason, it is possible that the diffusion time corrects the period from some hours to some minutes according to the specially curved form of diode. An example of the production method according to the invention will be described presently with reference to FIGS. 2 to 5.

Figure 2:
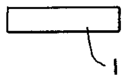
FIGS. 2, 3 and 4 show schematically three consecutive stages in the production of a diode according to the invention.

The semiconductor base plate of n-type germanium is denoted by 1 in FIG. 2. In theory and practice it is sufficient that this plate have a larger area than that of the junction to be produced. The required junction area can be determined by the value of the desired capacitance. Preferably used is a germanium disc of 0.5 to 5 mm. diameter, although any other desired shape and size of the germanium body is applicable, depending upon the particular requirements with respect to the junction and electrical characteristics desired. The thickness of the wafer is 10 to 200 microns. However, for reducing losses, it is preferable to make the wafer as thin as feasible, taking into account that it must not be damaged when the alloy-diffusion treatment is being performed. Losses can also be reduced by diffusing impurities of the same conductance type from opposite sides into the germanium body and to use an epitaxial wafer. In such cases, a greater thickness, within the above-mentioned range, can be employed to advantage. Among the germanium wafers employed and mentioned hereinafter were those having circular shape of 2 mm. diameter and approximately 50 microns thickness.

Figure 3:
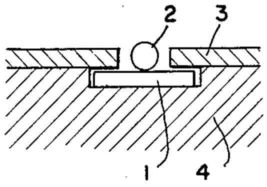

The n-type germanium wafer is placed into a jig as schematically shown in FIG. 3. The jig is made of graphite, stainless steel or mica, for example. According to FIG. 3, the wafer 1 is placed into the base portion 4 of such a jig and then partially covered by a plate 3 which forms part of the jig and serves to hold wafer 1 in place. Placed upon the wafer is a globule or grain 2 consisting of the above-mentioned lead alloy.

The alloy globule 2 is prepared as follows. Lead is placed into a crucible of quarts and heated to a temperature of about 400° C. under inert gas. Antimony or arsenic, as well as gallium as acceptor dopant, are then mixed into the molten lead, the antimony or arsenic being applied in the quantity required for obtaining the above-mentioned concentration. After cooling the alloy, it is placed into a small nozzle in which it is heated and molten. By applying pressure, the metal is ejected from the nozzle and shaped into a multitude of small grains which are screened by means of a classifying or analyzing filter.

In some cases the alloy material can also be used in form of leaves or foils. In this case the ingot can be pressed or rolled to the desired leaf shape. Another way of applying the alloy upon the germanium wafer is by way of vapor deposition using a suitable mask. These methods of contacting the germanium with the lead-donor acceptor alloy are substantially the same as those employed for alloying indium to germanium. Indeed, most of the techniques used for such purposes can also be utilized in conjunction with the present invention.

Generally, an alloy grain or globule of 10 microns to 1 mm. diameter is more easily applicable. However, if the alloy body must be larger, the leaf or foil shape is preferable, and if the shape of the junction to be formed is complicated, a vapor-deposition method is sometimes more easily applied. Of course, any other form and size of the alloy body other than those mentioned above can be used, depending upon the particular requirements, such as the size and shape of the semiconductor base plate. Generally, the size of the alloy grain or body and of the junction area is determined in accordance with the required characteristics. It is often easier and more reliable to find the best suitable size and shape by way of experiment.

When the semiconductor base plate with the alloy grain or globule is heated, the lead alloy starts melting at about 320° C. and germanium from the base plate will enter into the melt. When the just-mentioned temperature is reached and after a lapse of some time, the resulting liquid phase of the alloy grain becomes saturated by the melting germanium so that no further germanium will melt. From then on, antimony or arsenic will diffuse out of the alloy toward and into the semiconductor body. The concentration of the diffused region in the germanium crystal is dependent upon the amount of antimony or arsenic in the alloy grain; and the depth of diffusion is determined by the temperature obtaining at any time and also by the length of time during which the temperature is kept constant.

Figure 4:
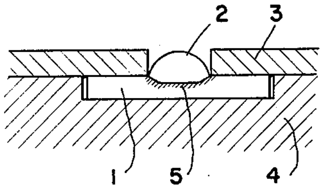
Figure 5:
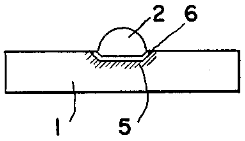
FIG. 5 shows schematically and in cross section the resulting diode.

In FIGS. 4 and 5, showing the diode during such stage of alloying diffusion treatment, the resulting diffusion layer is denoted by 5. When now the assembly is cooled, after applying the above-mentioned diffusion temperature during the necessary diffusion time, the molten germanium recrystallized back onto the base body and forms a regrown layer in the body. At this moment, this recrystallization region contains more gallium than antimony or arsenic and consequently forms a p-type region. Thus according to FIG. 5 a recrystallization region occurs at 6, and a diffusion region 5 is present beyond the recrystallization region, that is inward of the germanium body.

By attaching electrodes or terminal contacts to the bottom of the germanium body 1 and to the lead body 2 and applying, if desired, such conventional surface treatments as etching, the diode is completed.

Figure 6:
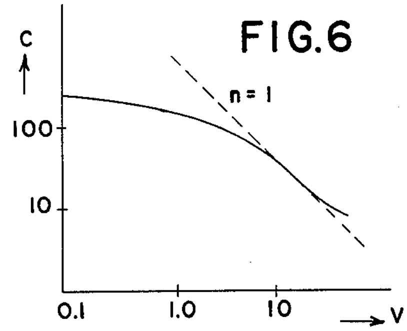
FIGS. 6 to 8 are explanatory graphs relating to different respective diodes made according to the invention.
Figure 7:
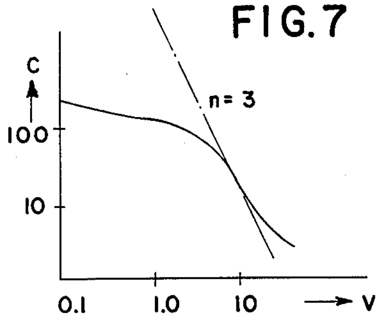
Figures 8, 9:
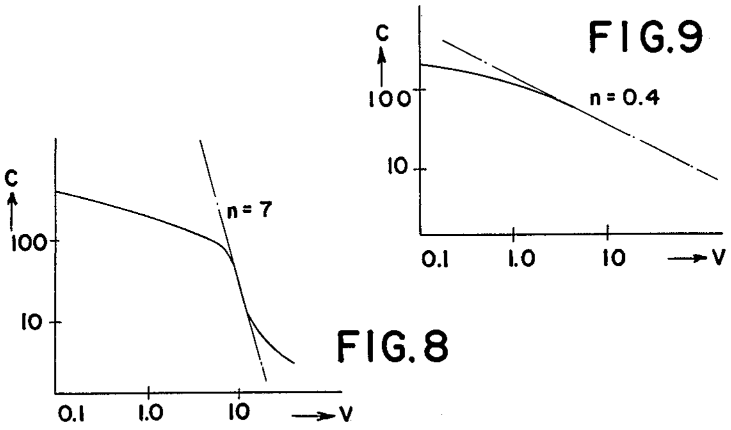
FIG. 9 is a graph relating to a comparable diode made by a different method.

Voltage-capacitance characteristics of variable-capacitance diodes made by the above-described method of the invention are represented by the graphs according to FIGS. 6 to 8. In each of these illustrations, the abscissa denotes negative bias voltage (in volt) and the ordinate denotes junction capacitance 6 (pf.), a logarithmic scale being employed on both axes. All of these characteristics relate to germanium diodes comprising an alloy grain of 350 micron diameter on n-type germanium of 2 x 2 x 0.05 mm. dimensions. FIG. 6 relates to a diode alloy-diffused at 700° C. with n-type germanium of 1.5 ohm cm. resistance, the lead alloy containing 0.25% antimony with p-type impurity (gallium). The change rate is $n=1$.

The characteristic shown in FIG. 7 relates to a diode made in the same manner as the one according to FIG. 6, except that n-type germanium of 9 ohm cm. resistance was used, and the change rate was $n=3$.

The diode whose characteristic is represented in FIG. 8 was alloy-diffused at 650° C. with n-type germanium of 10 ohm cm. resistance, using a lead alloy with 1% antimony. The change rate was $n=7$.

For comparison, FIG. 9 shows a characteristic of a germanium diode made by alloy-diffusing a lead alloy with 0.25% antimony to n-type germanium of 9 ohm cm. resistance, at a temperature above the mentioned range. It will be seen that the characteristic is no longer hyper-abrupt. When a lead alloy with an admixture of 10% antimony was used, the breakdown voltage was less than 6 volts, even when employing a processing temperature within the above-mentioned range.

I claim:

1. The method of producing a variable capacitance diode, which comprises contacting a semiconductor body of n-type germanium with an alloy of lead with donor substance and acceptor substance, the donor substance is selected from the group consisting of antimony and arsenic in an amount by weight of 0.02 to 5% for antimony and 0.01 to 0.5% for arsenic, alloying and simultaneously diffusing the lead-donor-acceptor alloy into the germanium body at a temperature between 550 and 720° C. and thereby producing a hyper-abrupt p-n junction.

2. The method of producing a variable capacitance diode, which comprises contacting a semiconductor body of n-type germanium with an alloy of lead with donor substance and acceptor substance, the donor substance is selected from the group consisting of antimony and arsenic in an amount by weight of 0.02 to 5% for antimony and 0.01 to 0.5% for arsenic, the acceptor substance is selected from the group consisting of gallium, indium, aluminum and boron, in an amount corresponding to about $10^{17}$ to about $10^{21}$ atoms per cc.; alloying and simultaneously diffusing the lead-donor-acceptor alloy into the germanium body at a temperature between 550 and 720° C., whereby a hyper-abrupt p-n junction is produced in the germanium body.

3. The method of producing a variable capacitance diode, which comprises contacting a semiconductor body of n-type germanium with an alloy of lead with gallium as acceptor dopant and antimony in an amount of about 0.02 to about 3.0% by weight; alloying and simultaneously diffusing the lead-donor-acceptor alloy into the germanium body by applying a temperature between 550 and 720° C. for a period of about 10 to few minutes, whereby a hyper-abrupt p-n junction is produced in the germanium body.

4. A variable capacitance diode comprising a semiconductor body of n-type germanium having a specific resistance of about 0.1 to about 20 ohm cm. and having an electrode formed of a lead alloy with donor substance and acceptor substance, the donor substance is selected from the group consisting of antimony and arsenic in an amount by weight of 0.02 to 5% for antimony and 0.01 to 0.5% for arsenic, said body having adjacent to said electrode an alloyed and diffused p-type region which contains said donor and acceptor substances and forms a hyper-abrupt p-n junction with the bulk of said body, said acceptor substance is selected from the group consisting of gallium, indium, aluminum and boron and having at said junction a concentration of about $10^{18}$–$10^{19}$ atoms per cc. and has in said region a concentration highest at said junction and decreasing toward said electrode with the distance from said junction.

References Cited by the Examiner

UNITED STATES PATENTS

| | | | |
|---|---|---|---|
| 2,998,334 | 8/1961 | Bakalar et al. | 148—185 |
| 3,001,895 | 9/1961 | Schwartz et al. | 148—185 |
| 3,069,297 | 12/1962 | Beale | 148—185 |

DAVID L. RECK, *Primary Examiner.*

HYLAND BIZOT, *Examiner.*

R. O. DEAN, *Assistant Examiner.*